(12) United States Patent
Kim et al.

(10) Patent No.: US 8,927,436 B2
(45) Date of Patent: Jan. 6, 2015

(54) THIN FILM TRANSISTOR AND METHOD OF MANUFACTURING TRENCH, METAL WIRE, AND THIN FILM TRANSISTOR ARRAY PANEL

(75) Inventors: Dae Ho Kim, Daegu (KR); Bong-Kyun Kim, Hwaseong-si (KR); Yong-Hwan Ryu, Yongin-si (KR); Hong Sick Park, Suwon-si (KR); Wang Woo Lee, Suwon-si (KR); Shin Il Choi, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 405 days.

(21) Appl. No.: 13/480,242

(22) Filed: May 24, 2012

(65) Prior Publication Data

US 2013/0183822 A1    Jul. 18, 2013

(30) Foreign Application Priority Data

Jan. 18, 2012    (KR) ........................ 10-2012-0005869

(51) Int. Cl.
*H01L 21/302*    (2006.01)
(52) U.S. Cl.
USPC ........... 438/710; 438/609; 438/637; 438/690; 438/700; 438/719
(58) Field of Classification Search
CPC ..................... H01L 21/3116; H01L 21/31144; H01L 21/67069; H01L 21/67075; H01L 27/1214; H01L 27/1251; H01L 27/3248
See application file for complete search history.

(56) References Cited

U.S. PATENT DOCUMENTS

| | | | |
|---|---|---|---|
| 7,163,890 B2 | 1/2007 | Kang et al. | |
| 7,718,524 B2 | 5/2010 | Ooka | |
| 2003/0100190 A1 | 5/2003 | Cote et al. | |
| 2004/0106293 A1 | 6/2004 | Igarashi | |
| 2005/0214694 A1* | 9/2005 | Hong et al. | 430/323 |
| 2005/0239290 A1 | 10/2005 | Hsu | |
| 2011/0053375 A1 | 3/2011 | Ishikawa et al. | |

FOREIGN PATENT DOCUMENTS

| | | |
|---|---|---|
| JP | 2005-033016 | 2/2005 |
| JP | 2010-153880 | 7/2010 |
| JP | 2011-151057 | 8/2011 |
| KR | 10-2005-0067934 | 7/2005 |

* cited by examiner

*Primary Examiner* — Kyoung Lee
(74) *Attorney, Agent, or Firm* — H.C. Park & Associates, PLC

(57) ABSTRACT

The present invention relates to a method for forming a trench that can remove residual particles in a trench using a metal mask, a method for forming a metal wire, and a method for manufacturing a thin film transistor array panel. The method for forming a trench includes: forming a first insulating layer on a substrate; forming a first metal layer on the first insulating layer; forming an opening by patterning the first metal layer; forming a trench by dry-etching the first insulating layer using the patterned first metal layer as a mask; and wet-etching the substrate. The dry-etching is performed using a main etching gas and a first auxiliary etching gas, and the first auxiliary etching gas includes argon.

20 Claims, 18 Drawing Sheets

THIN FILM TRANSISTOR AND METHOD OF MANUFACTURING TRENCH, METAL WIRE, AND THIN FILM TRANSISTOR ARRAY PANEL

CROSS-REFERENCE TO RELATED APPLICATION

This application claims priority from and the benefit of Korean Patent Application No. 10-2012-0005869, filed on Jan. 18, 2012, which is incorporated herein by reference for all purposes as if fully set forth herein.

BACKGROUND OF THE INVENTION

1. Field of the Invention

Exemplary embodiments of the present invention relate to a thin film transistor and a method for forming a trench, a method for forming a metal wire, and a method for manufacturing a thin film transistor array panel. More particularly, exemplary embodiments of the present invention relate to a thin film transistor and a method for forming a trench with reduced residual particles and a residual film in the trench, a method for forming a metal wire, and a method for manufacturing a thin film transistor array panel.

2. Discussion of the Background

A thin film transistor (TFT) is typically used as a switching element for independently driving each pixel in a flat panel display such as a liquid crystal display or an organic light emitting diode display. The thin film transistor array panel includes a thin film transistor, a pixel electrode that is connected thereto, a gate line that transmits a gate signal to the thin film transistor, and a data line that transmits a data signal.

The thin film transistor includes a gate electrode connected with a gate line to receive a gate signal, a semiconductor layer formed on the gate electrode, a source electrode connected with a data line to receive a data signal, and a drain electrode formed spaced apart from the source electrode and connected with the pixel electrode. In this case, the gate line, the gate electrode, the data line, the source electrode, and the drain electrode are made of metal wires.

In order to increase resolution, research and development have been conducted to increase pixel integration per unit area in the thin film transistor array panel, and for high-speed image signal processing, research and development have been made on using oxide semiconductor having high electron mobility or a low-resistive copper wire.

In such case, an insulating layer of several micrometers is deposited and a trench is formed, and then a cooper wire is formed in the trench to realize a low-resistive copper wire. When a photo etching process using a conventional photosensitive film is used to form the trench, the selectivity is significantly decreased.

Recently, research and development have been conducted on etching using a metal mask rather than using a photosensitive film, but use of the metal mask may cause generation of residual particles in the trench and the etching may not reach the bottom of the trench such that a residual film remains.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made to provide a method for forming a trench that may reduce residual particles in a trench using a metal mask, a method for forming a metal wire, and a method for manufacturing a thin film transistor array panel.

Exemplary embodiments of the present invention provide a method for forming a trench that may reduce a residual film by performing etching to the bottom of the trench, a method for forming a metal wire, and a method for manufacturing a thin film transistor array panel.

An exemplary embodiment of the present invention discloses a method for forming a trench, which includes: forming a first insulating layer on a substrate; forming a first metal layer on the first insulating layer; forming an opening by patterning the first metal layer; forming a trench by dry-etching the first insulating layer using the patterned first metal layer as a mask; and wet-etching the substrate. The dry-etching is performed using a main etching gas and a first auxiliary etching gas, and the first auxiliary etching gas includes argon.

Another exemplary embodiment of the present invention discloses a method for forming a metal wire, which includes: forming a first insulating layer on a substrate; forming a first metal layer on the first insulating layer; forming an opening by patterning the first metal layer; forming a trench by dry-etching the first insulating layer using the patterned first metal layer as a mask; removing the first metal layer by wet-etching the substrate; forming a second metal layer on the substrate; and forming a metal wire in the trench by polishing the second metal layer through a chemical mechanical polishing process. The dry-etching is performed using a main etching gas and a first auxiliary etching gas, and the first auxiliary etching gas includes argon.

Yet another exemplary embodiment of the present invention discloses a method for manufacturing a thin film transistor array panel, which includes: forming a first insulating layer on a substrate; forming a first metal layer on the first insulating layer; forming an opening by patterning the first metal layer; forming a trench by dry-etching the first insulating layer using the patterned first metal layer as a mask; removing the first metal layer by wet-etching the substrate; forming a second metal layer on the substrate; forming a gate electrode in the trench by polishing the second metal layer through a chemical mechanical polishing process; forming a gate insulating layer on the gate electrode; forming a semiconductor layer on the gate insulating layer; forming a source electrode and a drain electrode spaced apart from each other on the semiconductor layer; forming a passivation layer on the source electrode and the drain electrode; forming a contact hole in the passivation layer to partially expose the drain electrode; and forming a pixel electrode to be connected with the drain electrode on the passivation layer. The dry-etching is performed using a main etching gas and a first auxiliary etching gas, and the first auxiliary etching gas includes argon.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
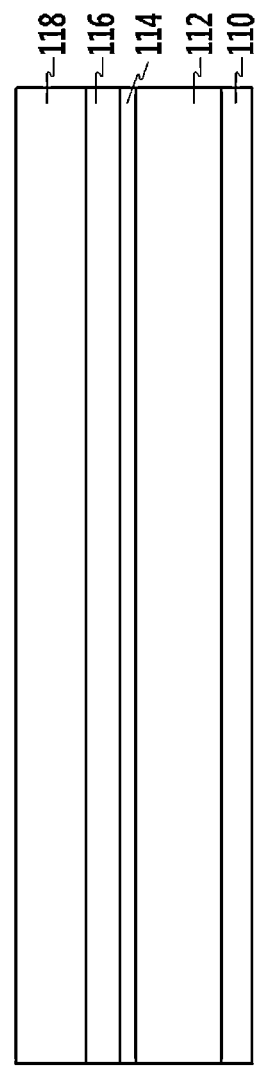
FIG. 1, FIG. 2, FIG. 3, FIG. 4, FIG. 5, and FIG. 6 are process cross-sectional views of a method for manufacturing a trench according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A method for manufacturing a trench according to an exemplary embodiment of the present invention will be described with reference to the accompanying drawings.

FIG. 1, FIG. 2, FIG. 3, FIG. 4, FIG. 5, and FIG. 6 are process cross-sectional views of a method for manufacturing a trench according to an exemplary embodiment of the present invention.

First, as shown in FIG. 1, a first insulating layer 112 is formed on a substrate 110 made of glass or plastic, a first metal layer 116 is formed on the first insulating layer 112, and a photosensitive film 118 is formed on the first metal layer 116.

The first insulating layer 112 may be made of SiOC, and may have a thickness of about 3 μm. As a low dielectric insulating material, SiOC is a silicon oxide doped with carbon. In order to form SiOC, methyl silsesquioxane (MSSQ) and the like may be coated by a spin-on-glass (SOG) method, or a gas containing a methyl silane-based organic component and silicon and a source gas containing an oxygen element such as $N_2O$ or $O_2$ may be supplied together with a carrier gas such as $N_2$, $NH_3$, helium (He), or argon (Ar) and then a plasma enhanced chemical vapor deposition (PECVD) method may be performed. Here, a carbon-containing group such as a methyl group ($CH_3$—) replaces at least one hydrogen in silane gas ($SiH_4$) such that the methyl silane-based organic component is formed.

The first metal layer 116 may be made of amorphous indium tin oxide (a-ITO) or indium zinc oxide (IZO), and may have a thickness of about 900 Å.

The photosensitive film 118 changes its characteristic by light, and may have a thickness of about 1.5 μm.

When the first insulating layer 112 is made of SiOC and the first metal layer 116 is made of a-ITO, a second insulating layer 114 may be additionally provided between the first insulating layer 112 and the first metal layer 116. In the drawings, the second insulating layer 114 is formed on the first metal layer 116, but the first metal layer 116 may be formed on the second insulating layer 114.

The second insulating layer 114 may be made of a silicon nitride, and may have a thickness of equal to or greater than about 500 Å. The second insulating layer 114 may enhance adherence between the first insulating layer 112 and the first metal layer 116.

Figure 2:
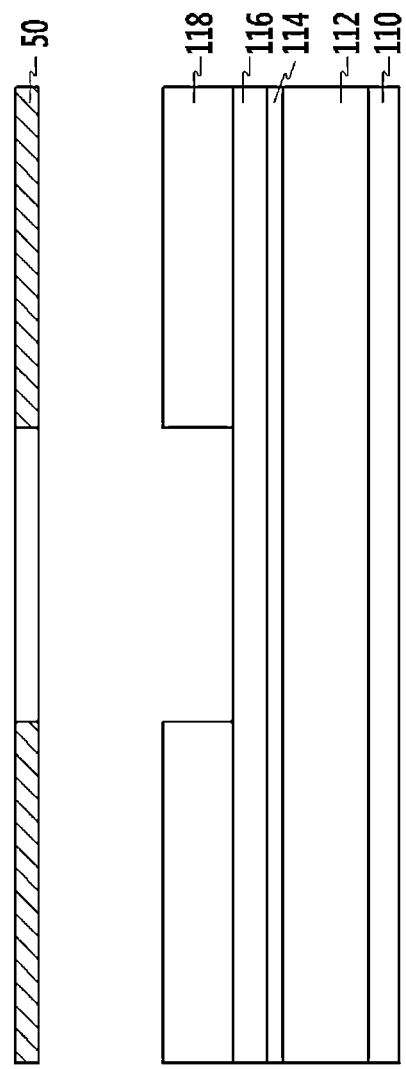

As shown in FIG. 2, the photosensitive film 118 is patterned through a photo process using a mask 50.

Figure 3:
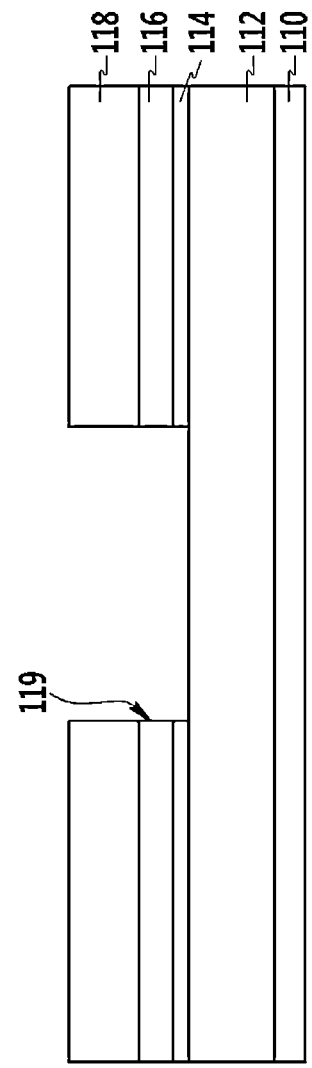

As shown in FIG. 3, the first metal layer 116 is etched using the patterned photosensitive film 118 as a mask to form an opening 119. Subsequently, the second insulating layer 114 disposed under the opening 119 of the first metal layer 116 is etched.

Figure 4:
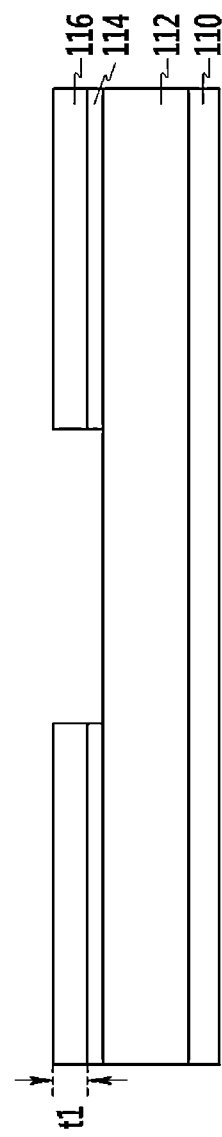

As shown in FIG. 4, the patterned photosensitive film 118 is removed. In this case, a thickness t1 of the first metal layer 116 is the same as the initial thickness.

Figure 5:
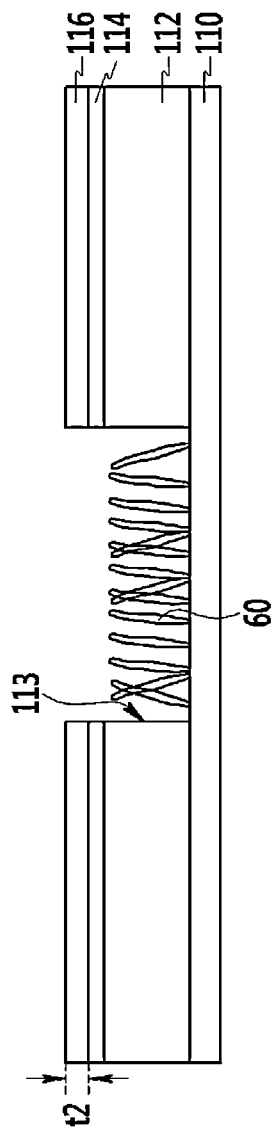

As shown in FIG. 5, the first insulating layer 112 is etched to form a trench 113 using the first metal layer 116 where the opening 119 is formed as a mask. In this case, the dry-etching may be performed in a dual-frequency capacitively coupled plasma etching reactor with frequencies of 13.56 MHz and 3.4 MHz.

The dry-etching may be performed using a main etching gas and a first auxiliary etching gas. The main etching gas is a gas that can etch the first insulating layer 112, and for example, a fluorine-based gas such as $SF_6$ and $NF_3$ may be used to etch the first insulating layer 112 made of SiOC. The first auxiliary etching gas may be argon (Ar), and a residual film in the bottom of the trench 113 may be removed by using the first auxiliary etching gas. A second auxiliary etching gas may also be used. The second auxiliary etching gas may be made of at least one of $O_2$, $H_2$, and $C_4F_8$, and a skew may be improved using the second auxiliary etching gas.

In the exemplary embodiment of the present invention, the first insulating layer 112 is dry-etched using the first metal layer 116 as a mask such that an etch rate can be further increased compared to a conventional case in which a photosensitive film is used as mask to etch the first insulating layer 112. For example, when the dry-etching process is performed under the condition of a pressure of 50 mT, 1000 W/1000 W, 100 sccm of $SF_6$ gas, 50 sccm of $O_2$ gas, and 60 seconds, an etch rate of the exemplary embodiment of the present invention is about 15,400 Å/min. On the other hand, when the dry-etching process is performed under the same condition using the photosensitive film as a mask, an etch rate is about 7200 Å/min. That is, the etch rate according to the exemplary embodiment of the present invention may be twice that of the conventional case. In addition, the etch rate is increased to about 23,300 Å/min when $NF_3$ is used as the main etching gas instead of $SF_6$.

The thickness t2 of the first metal layer 116 after dry-etching is thinner than the thickness t1 of the first metal layer 116 before dry-etching. This is because the first metal layer 116 may be partially etched during the etching process of the first insulating layer 112. In this case, although the thickness of the first metal layer 116 is decreased to a certain degree, a hole due to the decrease of the thickness is not formed. Therefore, the first insulating layer 112 disposed under the first metal layer 116 will not be affected. In contrast, the first insulating layer 112 may be affected when using the conventional photosensitive film as mask.

During the dry-etching process, residual particles 60 having a length of 0.5 μm to 1.5 μm may be formed in the trench 113. This is because the first metal layer 116 made of a metallic material such as a-IT or IZO is used as a mask for dry-etching the first insulating layer 112 and thus the residual particles 60 generated from partial-etching of the first metal layer 116 during etching of the first insulating layer 112 may remain in the trench 113.

Figure 6:
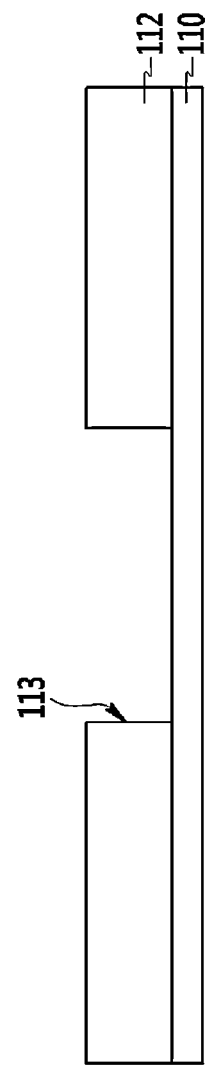

As shown in FIG. 6, a wet-etching is performed throughout a surface of the substrate 110 including the first metal layer 116. The wet-etching may be performed using an etching solution including sulfuric acid or nitric acid. The first metal layer 116 made of a metallic material such as a-ITO or IZO is etched by the etching solution including sulfuric acid or nitric acid, and simultaneously the residual particles 60 in the trench are also etched. For example, when the first metal layer 116 is wet-etched for 22 seconds or longer with an etch rate of 86 Å/min, the first metal layer 116 and the residual particles 60 may be simultaneously removed.

Subsequently, the second insulating layer 114 may be removed by etching, or the second insulating layer 114 may be left without undergoing the etching.

Hereinafter, removal of residual particles and residual film through the method for forming the trench according to the exemplary embodiment of the present invention will be described.

Figure 7:
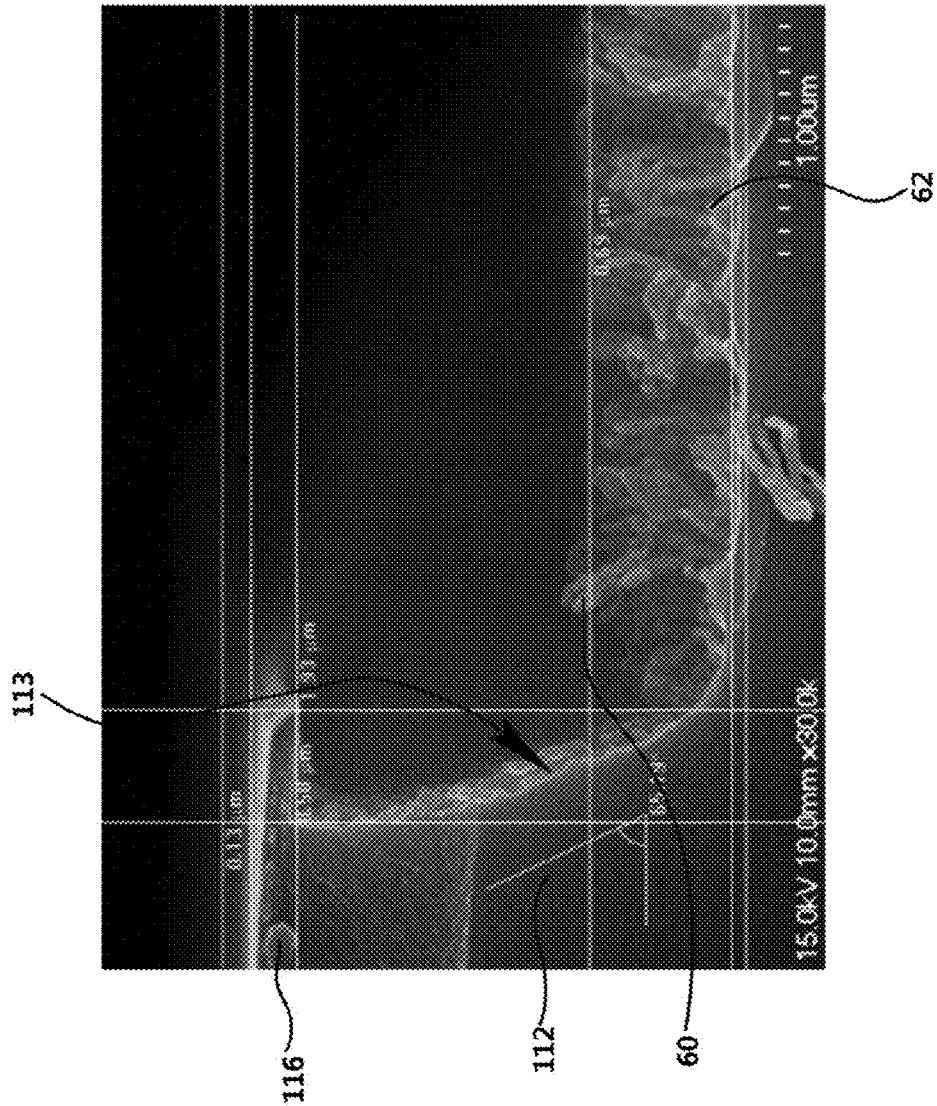
FIG. 7 is a SEM photo taken after performing dry-etching without using a first auxiliary etching gas.
Figure 8:
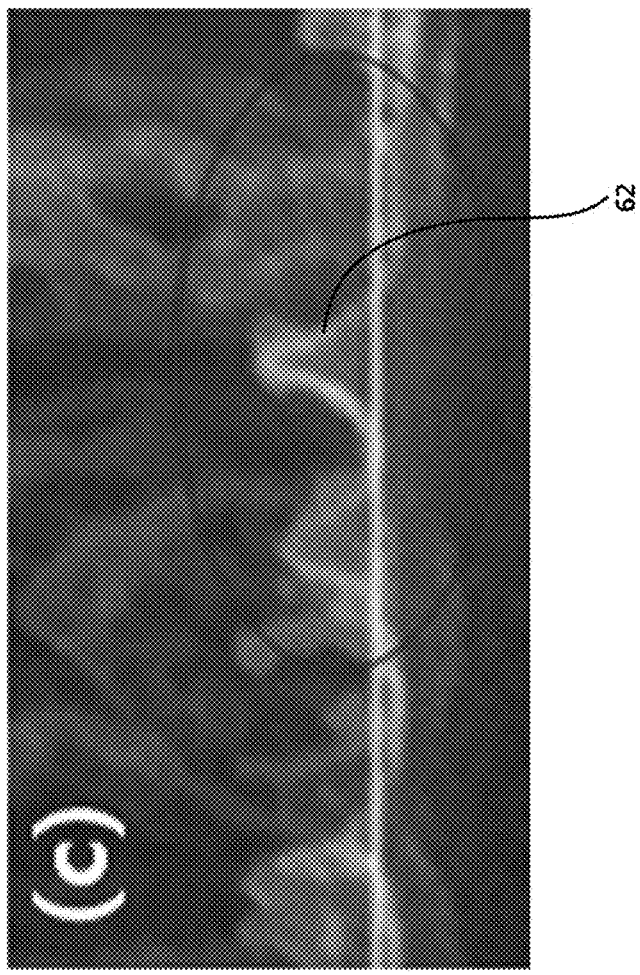
FIG. 8 is an enlarged view of a trench bottom of FIG. 7.
Figure 9:
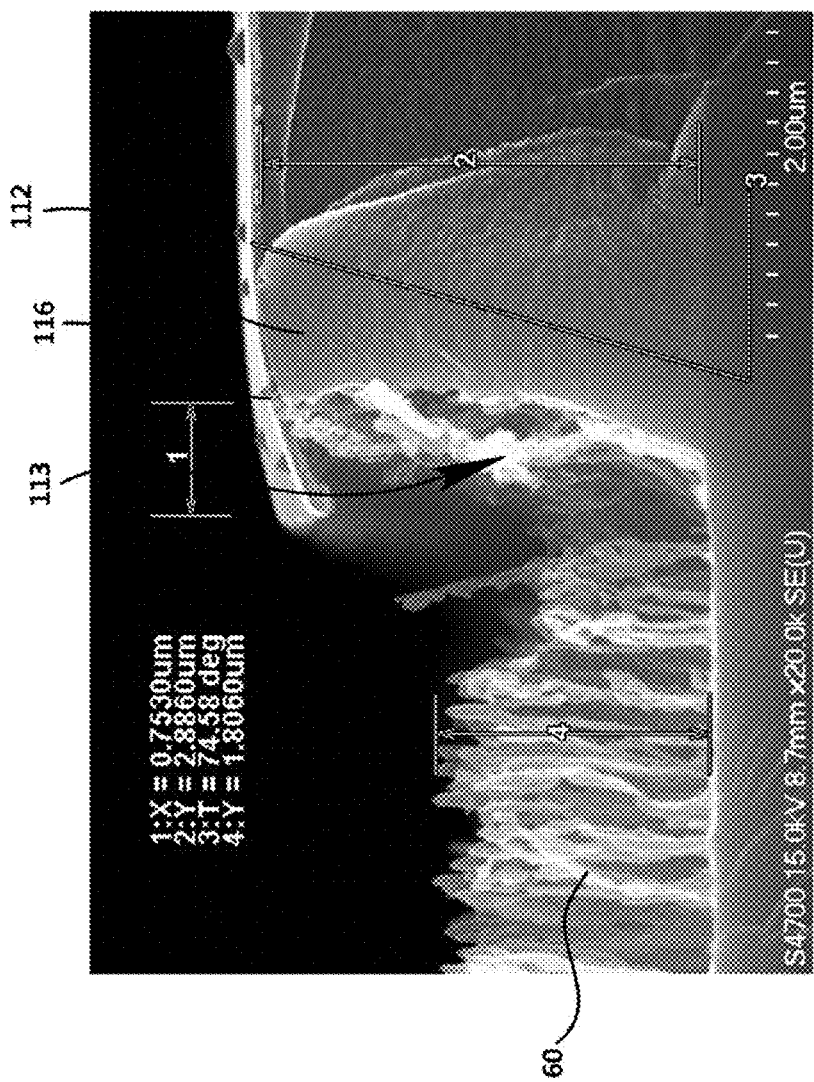
FIG. 9 shows a SEM photo taken after dry-etching is performed in a method for forming a trench according to an exemplary embodiment of the present invention.
Figure 10:
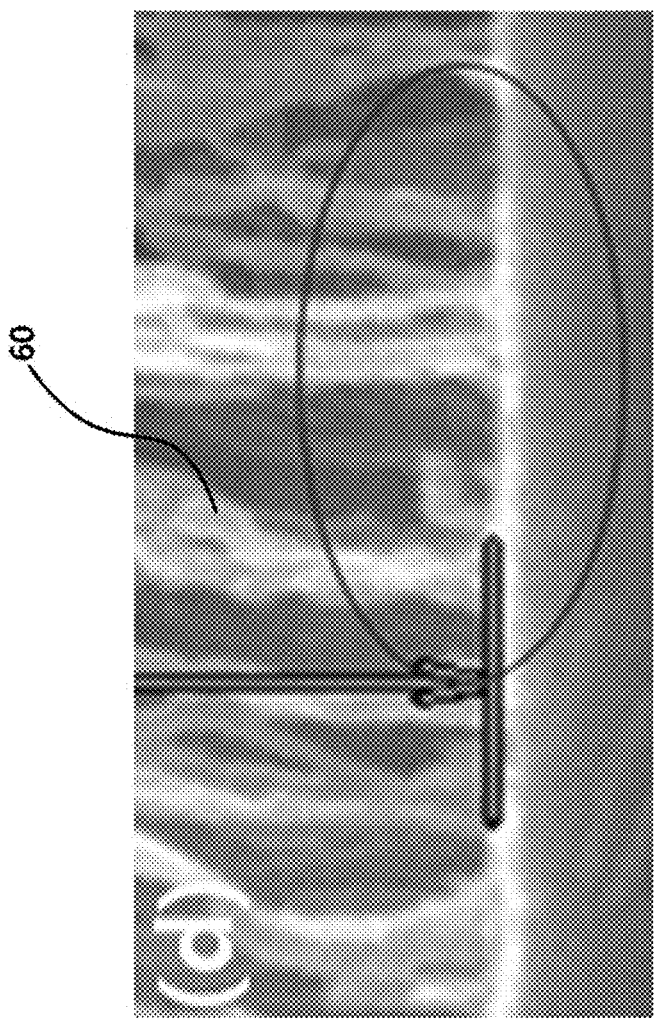
FIG. 10 is an enlarged view of the bottom of the trench of FIG. 9.
Figure 11:
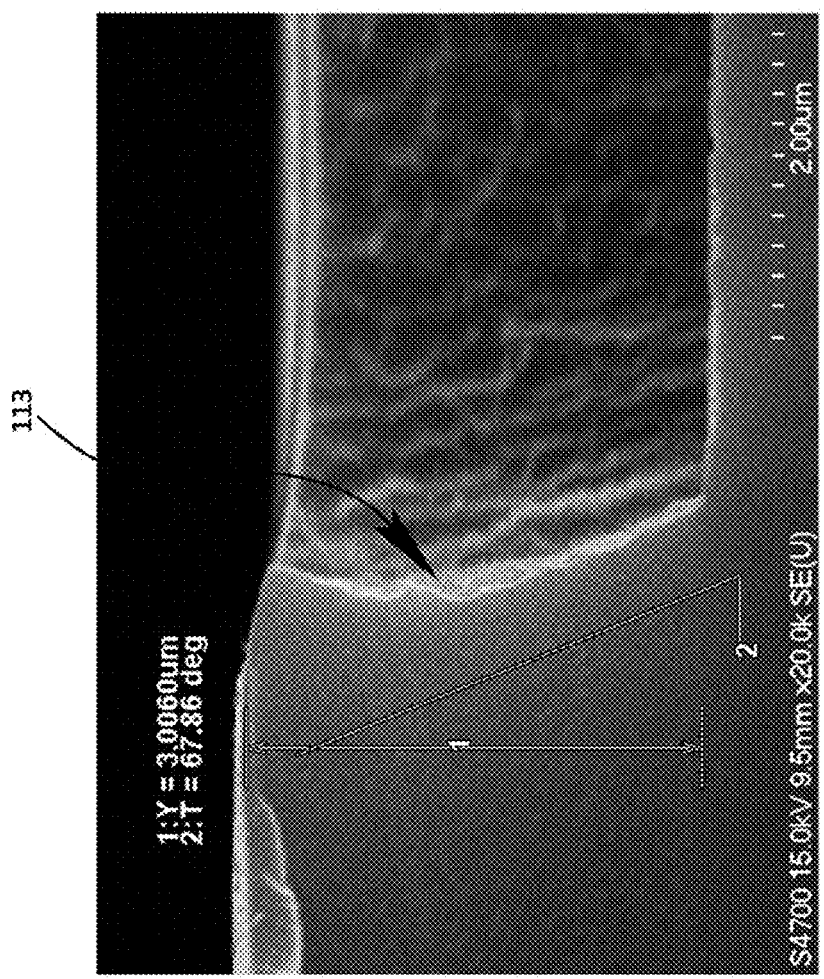
FIG. 11 shows a SEM photo taken after wet-etching is performed in the method for forming the trench according to the exemplary embodiment of the present invention.

FIG. 7 is a scanning electron microscope (SEM) photo taken after dry-etching is performed without using a first auxiliary etching gas, and FIG. 8 is an enlarged view of the bottom of the trench of FIG. 7. FIG. 9 is a SEM photo taken after dry-etching is performed by the method for forming the trench according to the exemplary embodiment of the present invention, and FIG. 10 is an enlarged view of the bottom of the trench of FIG. 9. FIG. 11 is a SEM photo taken after wet-etching is performed by the method for forming the trench according to the exemplary embodiment of the present invention.

Referring to FIG. 7 and FIG. 8, it can be observed that a residual film 62 remains in the bottom of the trench 113 when the dry-etching is performed using the main etching gas and the second auxiliary etching gas instead of the first auxiliary etching gas. Existence of the residual film 62 implies that the first insulating layer 112 is not completely etched but partially remains at the bottom of the trench 113 even after the dry-etching is performed. In addition, it can be observed that the residual particles 60 are generated in the trench 113 and grown upward from the bottom of the trench 113. The residual particles 60 are generated by partially etching the first metal layer 116 during the dry-etching of the first insulating layer 112 using the first metal layer 116 which is made of a metallic material such as a-ITO or IZO as a mask.

Referring to FIG. 9 and FIG. 10, it can be observed that the residual film 62 in the bottom of the trench 113 has been reduced, or in some cases, completely removed by performing the dry-etching using the first auxiliary etching gas made of argon (Ar) and the like together with the main etching gas and the second auxiliary etching gas. That is, the dry-etching is performed with the addition of the first auxiliary etching gas such that the residual film 62 remaining in the bottom of the trench 113 may be reduced.

The residual film 62 in the bottom of the trench 113 may be reduced, or completely eliminated, by adding the first auxiliary etching gas, but the residual particles 60 still remain. The residual particles 60 are generated from the first metal layer 116, and may be made of a different material from the first insulating layer 112. Thus, the residual particles 60 need to be reduced or removed using some other measures.

Referring to FIG. 11, it can be observed that the residual particles 60 remaining in the trench 113 are reduced, or completely removed, by performing wet-etching. In this case, the wet-etching is performed using an etching solution including sulfuric acid or nitric acid such that the first metal layer 116 formed on the first insulating layer 112 is removed, and the residual particles 60 made of the same component of the first metal layer 116 are etched together and thus reduced or eliminated.

That is, when the dry-etching is performed, the first auxiliary etching gas made of argon (Ar) and the like is added such that the residual film 62 in the bottom of the trench 113 may be reduced or eliminated. Then, the wet-etching is additionally performed to eliminate the residual particles 60 together with the first metal layer 116. Consequently, the bottom surface of the trench may be free of the residual film 62 and the residual metallic particles 60.

Hereinafter, a method for forming a metal wire according to an exemplary embodiment of the present invention will be described with reference to the accompanying drawings.

Figure 12:
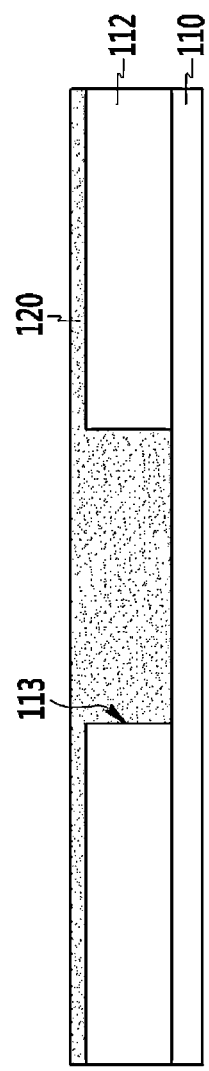
FIG. 12 and FIG. 13 are process cross-sectional views of a method for forming a metal wire according to an exemplary embodiment of the present invention.
Figure 13:
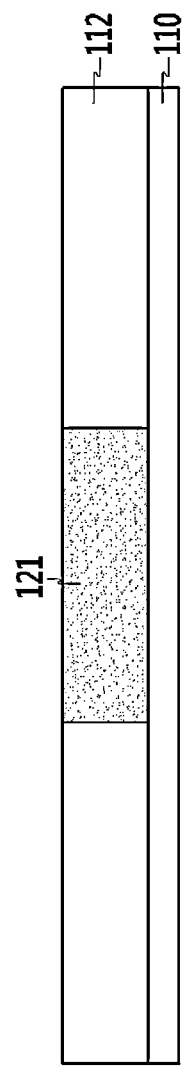

FIG. 12 and FIG. 13 are process cross-sectional views of a method for forming a metal wire according to an exemplary embodiment of the present invention.

First, a first insulating layer 112 is formed on a substrate 110 and a trench 113 is formed in the first insulating layer 112 according to the trench forming method of the above-described exemplary embodiment of the present invention. A method for forming the trench 113 in the first insulating layer 112 has been previously described, and therefore no further description will be provided.

As shown in FIG. 12, a second metal layer 120 is formed throughout the substrate 110 that includes the first insulating layer 112. The second metal layer 120 is formed on the first insulating layer 112 and is formed on the substrate 110 in the trench 113.

The second metal layer 120 may be made of copper (Cu). However, the present invention is not limited thereto, and thus the second metal layer 120 may be made of another metal having low resistance.

As shown in FIG. 13, an upper portion of the second metal layer 120 may be removed, such that portions of the second metal layer 120 disposed on the first insulating layer 112 are removed, and the upper surface of the remaining metal layer 120 (i.e., metal wire 121) is substantially coplanar with the upper surface of the first insulating layer 112. For example, the second metal layer 120 may be polished by chemical mechanical polishing (CMP) to remove the upper portion of the second metal layer 120. Accordingly, the second metal layer 120 provided in the trench 113 remains such that a metal wire 121 is formed.

Since the metal wire 121 is formed in the trench 113, the shape of the metal wire 121 depends on the shape of the trench 113. Thus, the trench 113 is formed according to a desired design of the metal wire 121 and then the metal wire 121 is formed therein.

In the method for forming the metal wire according to the present exemplary embodiment, the metal wire 121 is formed after a residual film or residual particles in the trench 113 are reduced or removed. As described above, since the metal wire 121 is formed while no particles (or impurities) remain in the trench 113, the characteristic of the metal wire 121 may be further improved.

Further, the first insulating layer 112 where the trench 113 is formed has a thickness in a micrometer order, and therefore the metal wire 121 has a thickness in a micrometer order as well. Thus, a low-resistive wiring can be realized by increasing the thickness of the metal wire 121.

Hereinafter, a method for manufacturing a thin film transistor array panel according to an exemplary embodiment of the present invention will be described.

FIG. 14, FIG. 15, FIG. 16, FIG. 17, and FIG. 18 are process cross-sectional views of a thin film transistor array panel according to an exemplary embodiment of the present invention.

First, a first insulating layer 112 is formed on a substrate 110 and a trench 113 is formed in the first insulating layer 112 by a trench forming method according to the previously described exemplary embodiment of the present invention. Since the method for forming the trench 113 in the first insulating layer 112 has been previously described in detail, no further description will be provided.

Figure 14:
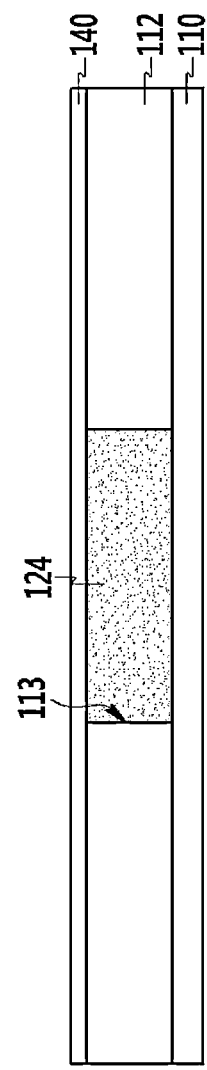
FIG. 14 to FIG. 18 are process cross-sectional views of a method for manufacturing a thin film transistor array panel according to an exemplary embodiment of the present invention.

As shown in FIG. 14, a gate electrode 124 is formed in the trench 113 by the method for forming the metal wire of the previously described exemplary embodiment of the present invention. The method for forming the gate electrode 124 in the trench 113 is equivalent to the method for forming the metal wire 121 of FIG. 13 in the trench 113 described in the method for forming the metal wire according to the previously described exemplary embodiment of the present invention, and therefore no further description will be provided.

The gate electrode 124 may be made of a metallic material such as copper (Cu), and may have a thickness of about 3 µm. Thus, high-speed transmission of signals can be realized by forming the gate electrode 124 as a low-resistive metal wire.

The gate electrode 124 is formed in the trench 113 and then a gate insulating layer 140 is formed on the gate electrode 124. The gate insulating layer 140 may be formed by deposing silicon oxide (SiOx) or silicon nitride (SiNx) throughout the substrate 110 including the gate electrode 124.

Figure 15:
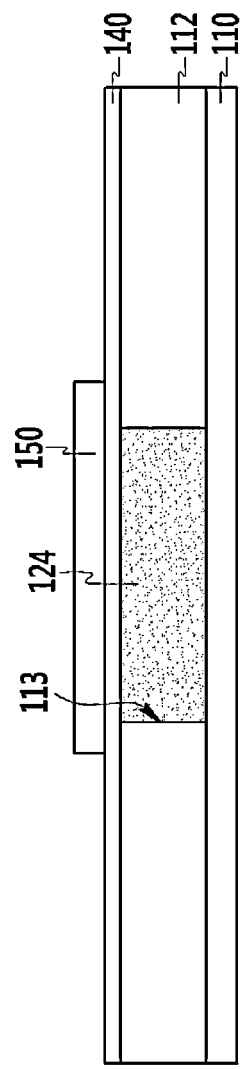

As shown in FIG. 15, a semiconductor layer 150 is formed on the gate insulating layer 140. The semiconductor layer 150 may be formed on the gate electrode 124.

The semiconductor layer 150 may be made of amorphous silicon, polycrystalline silicon (polysilicon), a metal oxide, and the like. When the semiconductor layer 150 is made of a metal oxide, a metal such as indium gallium zinc oxide (IGZO), zinc tin oxide (ZTO), indium tin oxide (IZO), and the like may be used.

Figure 16:
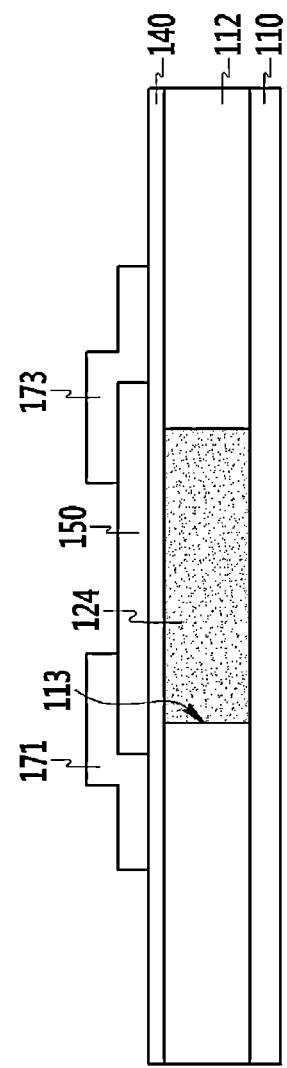

As shown in FIG. 16, a source electrode 171 and a drain electrode 173 are formed spaced apart from each other on the semiconductor layer 150. The source electrode 171 and the drain electrode 173 may be formed of a single layer or a multiple layer such as a double or triple layer using a metallic material.

Alternatively, the source electrode 171 and the drain electrode 173 may be formed by the method for forming the metal wire according to the previously described exemplary embodiment of the present invention. That is, an insulating layer is made of SiOC on the substrate, the trench is formed in the insulating layer, and then the source electrode 171 and the drain electrode 173 made of copper are formed.

In this case, when the insulating layer is made of SiOC on the semiconductor layer 150 and then the trench is formed, the semiconductor layer 150 may be damaged during an etching process for forming the trench. In order to reduce the occurrence of damage to the semiconductor layer 150, an etch stopper may be formed on the semiconductor layer 150. Alternatively, the source electrode 171 and the drain electrode 173 may be formed first and then the semiconductor layer 150 may be formed.

Figure 17:
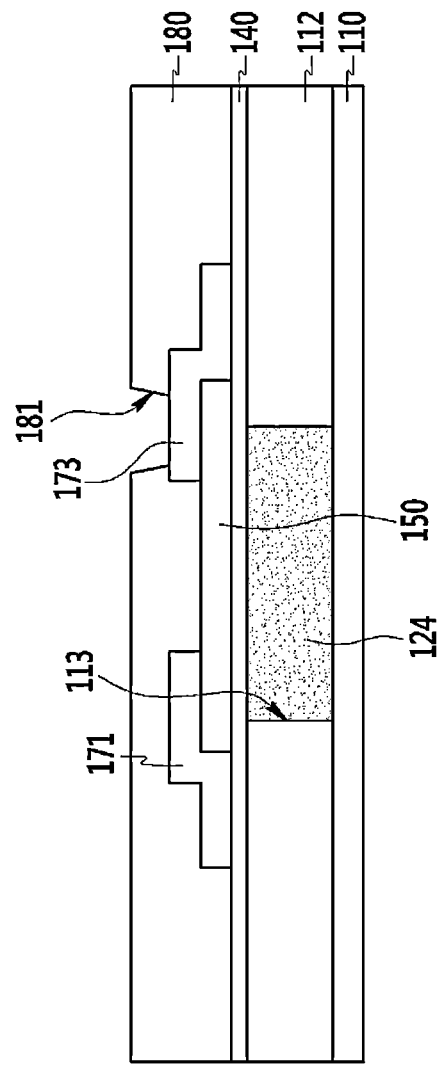

As shown in FIG. 17, a passivation layer 180 is formed on the source electrode 171 and the drain electrode 173. The passivation layer 180 may be made of an inorganic insulating material or an organic insulating material, and may be formed of a double layer of an inorganic insulating material and an organic insulating material.

Subsequently, a contact hole 181 is formed in the passivation layer 180 to partially expose the drain electrode 173.

Figure 18:
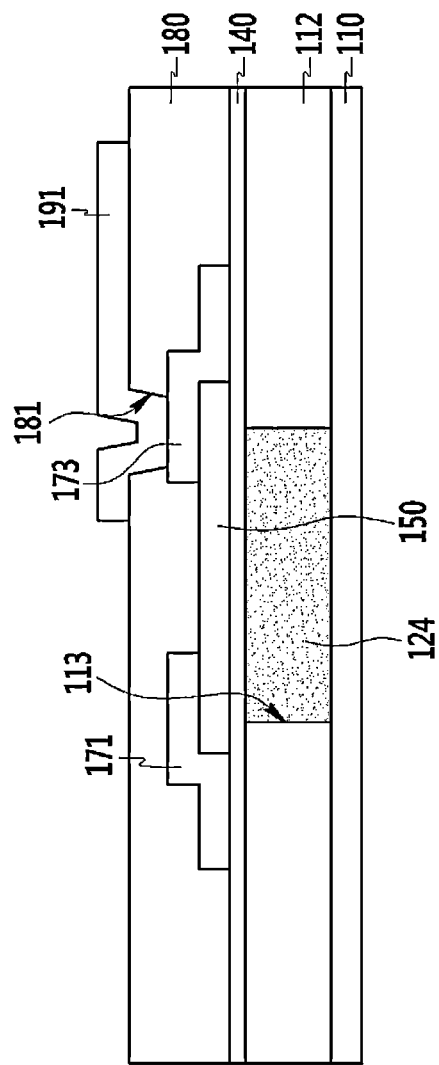

As shown in FIG. 18, a pixel electrode 191 is formed to be connected with the drain electrode 173 on the passivation layer 180. The pixel electrode 191 may be connected with the drain electrode 173 through the contact hole 181. The pixel electrode 191 may be made of a transparent metallic material such as indium tin oxide (ITO), indium zinc oxide (IZO), and the like.

Although not shown, in FIG. 14, a gate line connected with the gate electrode 124 for transmission of a gate signal may be formed together when the gate electrode 124 is formed. In addition, in FIG. 16, a data line connected with the source electrode 171 for transmission of a data signal may be formed together when the source electrode 171 and the drain electrode 173 are formed.

In the present exemplary embodiment, the method for forming the metal wire according to the previously described exemplary embodiment may be used when forming the gate electrode, the source electrode, and the drain electrode, but the present invention is not limited thereto. Not only the gate electrode, the source electrode, and the drain electrode but also other metal wires included in the thin film transistor array panel may be formed according to the method for forming the metal wire of the exemplary embodiment of the present invention.

FIG. 14, FIG. 15, FIG. 16, FIG. 17, and FIG. 18 illustrate the structure of bottom gate TFTs. The principles of the present invention, however, may be equally applicable to top gate TFTs.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a trench, comprising:
   forming a first insulating layer on a substrate;
   forming a first metal layer on the first insulating layer;
   forming an opening by patterning the first metal layer;
   forming a trench by dry-etching the first insulating layer using the patterned first metal layer as a mask; and
   wet-etching the substrate,
   wherein the dry-etching is performed using a main etching gas and a first auxiliary etching gas, and
   the first auxiliary etching gas comprises argon.

2. The method of claim 1, wherein the first insulating layer comprises SiOC.

3. The method of claim 2, wherein the first metal layer comprises amorphous indium tin oxide (a-ITO) or indium zinc oxide (IZO).

4. The method of claim 3, wherein the wet-etching is performed using an etching solution comprising sulfuric acid or nitric acid.

5. The method of claim 4, wherein, in the wet-etching, the first metal layer is removed.

6. The method of claim 3, wherein the first metal layer comprises a-ITO, and after forming the first insulating layer, the method for forming the trench further comprises forming a second insulating layer on the first insulating layer, and the first metal layer is formed on the second insulating layer.

7. The method of claim 6, wherein the second insulating layer comprises silicon nitride.

8. The method of claim 7, further comprising removing the second insulating layer after the wet-etching is performed.

9. The method of claim 2, wherein the main etching gas comprises $SF_6$ or $NF_3$.

10. The method for forming the trench of claim 9, wherein the dry-etching is performed using a second auxiliary etching gas, and the second auxiliary etching gas comprises at least one of $O_2$, $H_2$, and $C_4F_8$.

11. A method for forming a metal wire, comprising:
forming a first insulating layer on a substrate;
forming a first metal layer on the first insulating layer;
forming an opening by patterning the first metal layer;
forming a trench by dry-etching the first insulating layer using the patterned first metal layer as a mask;
removing the first metal layer by wet-etching the substrate;
forming a second metal layer on the substrate; and
forming a metal wire in the trench by removing portions of the second metal layer disposed outside the trench,
wherein the dry-etching is performed using a main etching gas and a first auxiliary etching gas, and
the first auxiliary etching gas comprises argon.

12. The method of claim 11, wherein the metal wire comprises copper.

13. The method of claim 12, wherein the first insulating layer comprises SiOC and the main etching gas comprises SF6 or $NF_3$.

14. The method of claim 13, wherein the dry-etching is performed further using a second auxiliary etching gas, and the second auxiliary etching gas comprises at least one of $O_2$, $H_2$, and $C_4F_8$.

15. The method of claim 12, wherein the first metal layer comprises a-ITO or IZO, and the wet-etching is performed using an etching solution comprising sulfuric acid or nitric acid.

16. The method for forming the metal wire of claim 15, wherein, in the wet-drying, the first metal layer is removed.

17. The method of claim 12, wherein the first metal layer comprises a-ITO, and after forming the first insulating layer, the method for forming the metal wire further comprises forming a second insulating layer on the first insulating layer, and the first metal layer is formed on the second insulating layer and the second insulating layer comprises silicon nitride.

18. A method for manufacturing a thin film transistor array panel, comprising:
forming a first insulating layer on a substrate;
forming a first metal layer on the first insulating layer;
forming an opening by patterning the first metal layer;
forming a trench by dry-etching the first insulating layer using the patterned first metal layer as a mask;
removing the first metal layer by wet-etching the substrate;
forming a second metal layer on the substrate;
forming a gate electrode in the trench by polishing the second metal layer through a chemical mechanical polishing process;
forming a gate insulating layer on the gate electrode;
forming a semiconductor layer on the gate insulating layer;
forming a source electrode and a drain electrode spaced apart from each other on the semiconductor layer;
is forming a passivation layer on the source electrode and the drain electrode;
forming a contact hole in the passivation layer to partially expose the drain electrode; and
forming a pixel electrode to be connected with the drain electrode on the passivation layer,
wherein the dry-etching is performed using a main etching gas and a first auxiliary etching gas, and the first auxiliary etching gas comprises argon.

19. The method of claim 18, wherein the metal wire comprises copper, the first insulating layer comprises SiOC, and the main etching gas comprises SF6 or $NF_3$.

20. The method of claim 18, wherein the first metal layer comprises a-ITO or IZO, and the wet-etching is performed using an etching solution comprising sulfuric acid or nitric acid.

* * * * *